«12» United States Patent
Zillmann et al.

«10» Patent No.: US 9,921,640 B2
«45» Date of Patent: Mar. 20, 2018

«54» INTEGRATED VOLTAGE REGULATORS WITH MAGNETICALLY ENHANCED INDUCTORS

«71» Applicant: INTEL CORPORATION, Santa Clara, CA (US)

«72» Inventors: Uwe Zillmann, Braunschweig (DE); Andre Schaefer, Braunschweig (DE); Ruchir Saraswat, Swindon (GB); Telesphor Kamgaing, Chandler, AZ (US); Paul B. Fischer, Portland, OR (US); Guido Droege, Braunschweig (DE)

«73» Assignee: Intel Corporation, Santa Clara, CA (US)

«*» Notice: Subject to any disclaimer, the term of this patent is extended or adjusted under 35 U.S.C. 154(b) by 1314 days.

«21» Appl. No.: 13/631,092

«22» Filed: Sep. 28, 2012

«65» Prior Publication Data

US 2014/0092574 A1    Apr. 3, 2014

«51» Int. Cl.
*H01L 23/48* (2006.01)
*G06F 1/32* (2006.01)
(Continued)

«52» U.S. Cl.
CPC .... *G06F 1/3296* (2013.01); *H01L 2924/0002* (2013.01); *H05K 1/0262* (2013.01);
(Continued)

«58» Field of Classification Search
CPC .......... G06F 1/3296; H01L 2924/0002; H05K 1/0262; H05K 1/165
(Continued)

«56» References Cited

U.S. PATENT DOCUMENTS 4,622,627 A * 11/1986 Rodriguez ............ H01F 27/022
                                                    361/782
6,998,952 B2 * 2/2006 Zhou ................... H01F 17/0033
                                                    29/602.1
(Continued)

FOREIGN PATENT DOCUMENTS

KR    1020070048260        5/2007
KR    1020110079815        7/2011
KR    10-2011-0135294 A    12/2011

OTHER PUBLICATIONS

Office Action and Search Report from Taiwan Intellectual Property Office (IPO) for Taiwan Patent Application No. 102133556 dated Sep. 2, 2015 and English translations thereof.
(Continued)

*Primary Examiner* — Steven T Sawyer
«74» *Attorney, Agent, or Firm* — Schwabe, Williamson & Wyatt P.C.

«57» ABSTRACT

Magnetically enhanced inductors integrated with microelectronic devices at chip-level. In embodiments, magnetically enhanced inductors include a through substrate vias (TSVs) with fill metal to carry an electrical current proximate to a magnetic layer disposed on a substrate through which the TSV passes. In certain magnetically enhanced inductor embodiments, a TSV fill metal is disposed within a magnetic material lining the TSV. In certain magnetically enhanced inductor embodiments, a magnetically enhanced inductor includes a plurality of interconnected TSVs disposed proximate to a magnetic material layer on a side of a substrate. In embodiments, voltage regulation circuitry disposed on a first side of a substrate is integrated with one or more magnetically enhanced inductors utilizing a TSV passing through the substrate. In further embodiments, integrated circuitry on a same substrate as the magnetically enhanced inductor, or on
(Continued)

another substrate stacked thereon, completes the VR and/or is powered by the VR circuitry.

24 Claims, 14 Drawing Sheets

(51) Int. Cl.
*H05K 1/02* (2006.01)
*H05K 1/16* (2006.01)

(52) U.S. Cl.
CPC .......... *H05K 1/165* (2013.01); *Y02B 60/1285* (2013.01); *Y10T 29/4913* (2015.01)

(58) Field of Classification Search
USPC ....... 361/760, 762, 782, 783, 794, 718, 803, 361/820; 257/774–776; 174/259–261
See application file for complete search history.

(56) References Cited

U.S. PATENT DOCUMENTS

| | | | | |
|---|---|---|---|---|
| 7,262,680 | B2* | 8/2007 | Wang | H01F 17/0013 257/531 |
| 7,280,024 | B2* | 10/2007 | Braunisch | H01F 17/0006 257/531 |
| 2004/0222773 | A1 | 11/2004 | Gardner et al. | |
| 2005/0190035 | A1 | 9/2005 | Wang et al. | |
| 2007/0030659 | A1* | 2/2007 | Suzuki | H01F 17/0013 361/793 |
| 2008/0001699 | A1* | 1/2008 | Gardner | H01F 10/16 336/200 |
| 2008/0309442 | A1 | 12/2008 | Hebert | |
| 2009/0140383 | A1 | 6/2009 | Chang et al. | |
| 2010/0109123 | A1* | 5/2010 | Strzalkowski | H01F 17/0013 257/531 |
| 2011/0073987 | A1* | 3/2011 | Mackh | H01L 21/76898 257/531 |
| 2011/0169596 | A1 | 7/2011 | Ahrens et al. | |
| 2012/0009689 | A1* | 1/2012 | Smeys | H01F 17/0006 438/3 |
| 2013/0027127 | A1* | 1/2013 | Topaloglu | H01L 23/66 327/564 |

OTHER PUBLICATIONS

International Search Report and Written Opinion dated Dec. 27, 2013 for PCT/US2013/058796 filed Sep. 9, 2013.
International Preliminary Report and Written Opinion for PCT/US2013/058796, International filing Sep. 9, 2013, dated Apr. 9, 2015.
International Application No. PCT/US2011/068285 filed Dec. 31, 2011, titled, "Fully Integrated Voltage Regulators for Multi-Stack Integrated Circuit Architectures," 19 pages.
International Search Report for International Application No. PCT/US2011/068285 filed Dec. 31, 2011, titled, "Fully Integrated Voltage Regulators for Multi-Stack Integrated Circuit Architectures," 19 pages.
Gardner, "Integrated Inductors with Magnetic Materials for On-Chip Power Conversion," Circuits Research Lab & Future Technology Reseach, from hotchips.org, 36 pages.
Jamieson, et al., "Optimization of Magnetic Enhancement Layers for High-Frequency Transmission Line Micro-inductors," from International Workshop on Power Supply on Chip, 2008, 1 page.
Bontzios, et al., "Prospects of 3D Inductors on Through Silicon Vias Processes for 3D ICs," from 2011 IEEE/IFIP 19th International Conference on VLSI and System-on-Chip, pp. 90-93.

* cited by examiner

US 9,921,640 B2

INTEGRATED VOLTAGE REGULATORS WITH MAGNETICALLY ENHANCED INDUCTORS

TECHNICAL FIELD

Embodiments of the present invention generally relate to microelectronic chip integration of voltage regulators, and more particularly relate to integrated voltage regulators employing magnetically enhanced inductors.

BACKGROUND

Integrated power supply circuits formed on one or more substrates are becoming more important as packaged device form factors are reduced for greater device mobility and as packaged device density is increased, for example through three-dimensional integrated circuit (3DIC) architectures. Voltage regulators (VRs) often employ inductors (e.g., inductor-capacitor (LC)-buck converters, etc.) because power supply architectures that avoid inductors, such as switched capacitor designs, are often limited to lower powers making them unsuitable for many high density 3DIC applications. Although many on-chip inductor designs exist (e.g., planar or multi-layer spirals, helixes, serpentines, etc.), they are difficult to fabricate with integrated circuits and often require very large areas to achieve inductance values of even a nanoHenry (nH) due to low efficiency numbers.

Fully integrated LC-VRs employing high efficiency inductors are therefore advantageous.

BRIEF DESCRIPTION OF THE DRAWINGS

Embodiments of the present invention are illustrated by way of example, and not limitation, in the figures of the accompanying drawings in which.

DETAILED DESCRIPTION

Figure 1A:
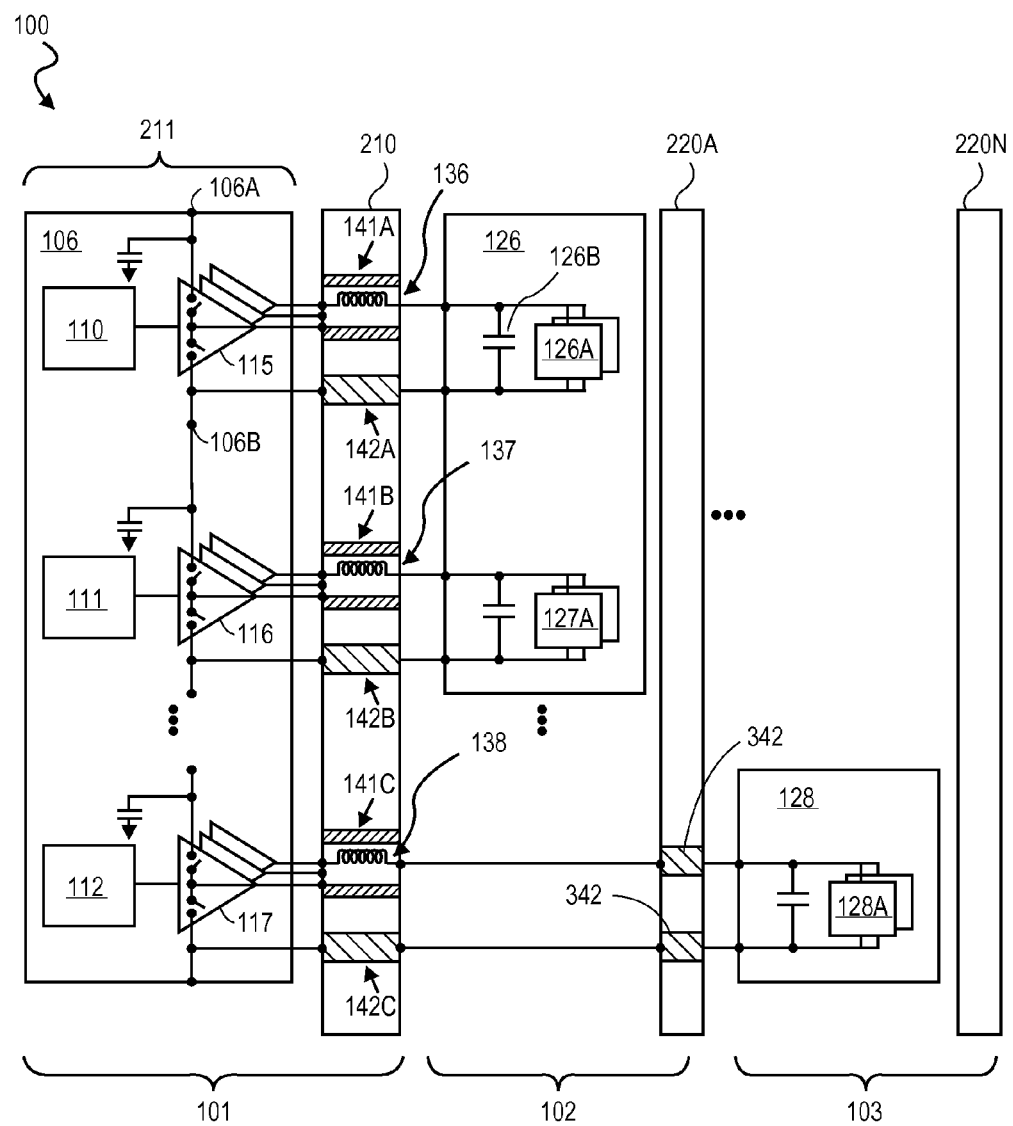
FIG. 1A schematically illustrates a 3DIC integrated VR architecture employing magnetic through substrate vias (MTSVs), in accordance with embodiments.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive. Furthermore, for clarity of description same reference numbers are retained for functionally or structurally equivalent features across the figures.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

Described herein are magnetically enhanced inductors integrated with microelectronic device circuitry on an IC chip. Generally, a magnetically enhanced inductor employs a magnetic material disposed over at least one surface of a substrate to increase an inductance value of a current carrying conductor relative to that which would be achieved by same conductor configuration in absence of the magnetic material. In embodiments, magnetically enhanced inductors include a through substrate via (TSV) fill metal to carry an electrical current proximate to a magnetic layer disposed on a substrate through which the TSV extends. In some magnetically enhanced inductor embodiments, a TSV fill metal is disposed within a magnetic material lining the TSV. In some magnetically enhanced inductor embodiments, a plurality of interconnected TSVs is proximate to a magnetic material layer disposed on a side of a substrate. In embodiments, voltage regulation circuitry integrated on a first side of a substrate is electrically coupled to one or more magnetically enhanced inductors utilizing a TSV extending through the substrate. In further embodiments, integrated circuitry on a same substrate as the magnetically enhanced inductor, or on another substrate vertically integrated into a 3D stack, is powered by the voltage regulation circuitry.

In embodiments, a 3DIC includes one or more fully integrated voltage regulators employing one or more magnetically enhanced inductors. FIG. 1A schematically illustrates a 3DIC integrated VR architecture 100 employing a stack of IC chips 101, 102, and 103. As shown, the first IC chip 101 includes a first substrate 210 (e.g., silicon) with an IC 106 disposed on the substrate frontside 211. In the exemplary embodiment the IC 106 forms a portion of a VR for individual power supply of one or more logic and/or memory circuit (i.e., load circuits) disposed on the separate IC chips 102, 103, etc. that are stacked upon the chip 101. While the IC 106 may entail any conventional power supply circuit, in an exemplary switching supply embodiment the first IC 106 includes a plurality of power switches 115 (e.g., power MOSFETs arrayed across a first region of the frontside 211) communicatively coupled to a pulse width modulator (PWM) circuit 110. The IC 106 receives power (e.g., 3.3V, 12V, etc.), from a board or package supply, coupled through bumps 106A (e.g., power) and 106B (e.g., ground).

In embodiments, output from a IC 106 passes through a magnetically enhanced inductor disposed on the same substrate as at least a portion of the VR circuit en route to a load circuit. As illustrated in FIG. 1A for example, output from the IC 106 is electrically coupled to a first end of a magnetic through substrate via (MTSV) 136. As described further elsewhere herein, the MTSV 136 includes a magnetic material 141A forming a liner of the via with a conductive fill metal inside the magnetic material 141A. Presence of the magnetic material 141A enhances the inductance value of the MTSV relative to a conventional TSV of otherwise similar geometry.

The IC chip 102 includes an IC 126 disposed on a side of the substrate 220A. The IC 126 includes at least one load circuit 126A that is electrically coupled to a second end of the MTSV 136 and is to be powered by the ouptput of the IC 106. The load circuit 126A may be any memory (DRAM, Flash, magnetic tunnel junction memory, etc.) or logic (ASIC, FPGA) device known in the art and embodiments of the present invention are not limited in this respect. In the exemplary embodiment, the IC 126 further includes one or more decoupling capacitor 126B. As further illustrated in FIG. 1A, the load circuit 126A is coupled to one end of a non-magnetic TSV 142A passing through the substrate 210. The TSV 142A is further coupled to a second rail (e.g., ground) of the IC 106. As such the MTSV 136 and the TSV 142A provide the needed interconnection between the power supply circuitry on the chip 101 and the load circuitry on the chip 102, with the MTSV 136 further functioning as an integrated high quality inductive element of the VR circuitry with advantageously low resistance (e.g., mOhms) and an inductance value that is controllable (e.g., to more than 10 nH) by the permittivity and layer thickness of the magnetic material 141A for a given thickness of the substrate 210 and via hole diameter. In this illustrative coiless inductor embodiment, the length of the single MTSV 136 associated with the thickness of the substrate 210 defines a total conductive length of the inductor that extends adjacent to magnetic material 141A.

In embodiments, a plurality of power supply circuits are coupled to one or more load circuits through a plurality of magnetically enhanced inductors. As illustrated in FIG. 1A, the IC chip 101 includes additional power switch arrays for individual power supply of logic and/or memory circuits (i.e., load circuits) disposed on the separate IC chips 102, 103, etc. As illustrated, additional power switch arrays 116, 117 and PWMs 111, 112 may draw power substantially as described for IC 106 with output rails coupled through MTSVs 137 and 138, respectively, and ground returns coupled through TSVs 142B, and 142C, respectively. The MTSVs 137, 138 include magnetic material 141B, 141C, respectively. The multiple switch arrays together with the multiple MTSVs may form individual integrated VRs as well as multi-phase VRs in embodiments where each MTSV provides an individual inductor. This together with the high frequency operation (e.g., up to 200 Mhz) possible for chip-level integration reduces decoupling capacitor requirements as well as supply ripple. Furthermore, while a step-down VR embodiment is illustrated for providing stacked chips power regulated to a lower voltage (e.g., 1V), where a stacked chip has high voltage needs, step-up converters may also be provided with power switch arrays located on the upper die, again utilizing an MTSV as an inductive element of the integrated VR.

While in some embodiments the MTSVs 137, 138 have substantially the same efficiencies as the MTSV 136, in other embodiments there respective efficiencies differ by predetermined amounts, for example as a function of a desired resistance to L ratio where the diameters of MTSVs 136, 137, and/or 138 are separately targeted. Depending on the embodiment, the plurality of power rails output from the IC chip 101 may be distributed to one or more load circuits across one or more stacked IC chips 102, 103. In some exemplary embodiments, the separate power rails may be provided to separate load circuits 126A, 127A present in one IC 126. In other exemplary embodiments, the separate power rails may provide power to load circuits 126A, 128A in separate ICs 126, 128 on different stacked chips 102, 103. With non-magnetic TSVs 342 passing power rails through the intervening substrate 220A, any number of stacked chips may be powered by the IC 106 with the substrate 210 having MTSVs designed as inductive elements of a VR circuit having a desired efficiency. With the area required for a magnetically enhanced inductor reduced to be only slightly more than a conventional via for embodiments where a single MTSV is employed by an integrated VR, a large number of stacked chips may be powered with one or more integrated VR.

Figure 1B:
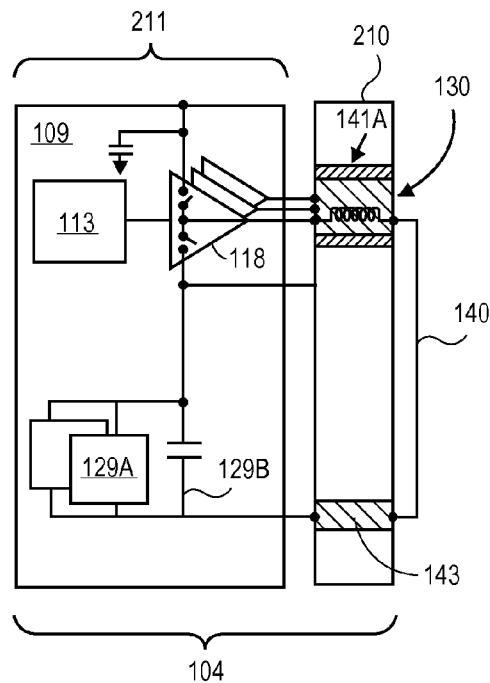
FIG. 1B schematically illustrates an integrated VR architecture employing MTSVs, in accordance with embodiments.

In embodiments, an integrated VR employing an MTSV powers an IC formed on a same substrate as the inductor. Just as the compact form factor of exemplary magnetically enhanced inductor embodiments described herein may power a number of stacked chips in a 3DIC architecture, the compact inductor form factors also enable supply circuitry to reside on a same chip as load circuitry that occupies substantial chip area, such as a microprocessor. FIG. 1B schematically illustrates an integrated VRM architecture employing magnetically enhanced inductors, in accordance with embodiments. As shown, the IC chip 104 includes the substrate 210 upon which both supply circuitry (e.g., power switch array 118 and PWM 113) and load circuitry 129A are disposed on the substrate frontside 211 as separate regions of the IC 109. The MTSV 130 is then connected in series by metallization 140, which for example may be disposed on a backside of the substrate 210, to the (non-magnetic) TSV 143 to provide a power rail from the supply circuitry to the load circuitry 129A with the decoupling cap(s) 129B there between. While in the exemplary embodiment a single MTSV is sufficient to provide a desired inductance and advantageously provides a highly compact inductor, a plurality of MTSVs interconnected in series may of course also be implemented as another embodiment of the present invention.

Figure 1C:
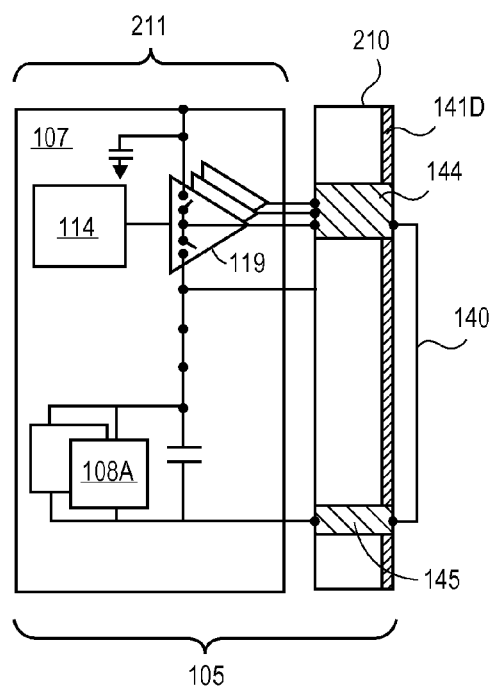
FIG. 1C schematically illustrates an integrated VR architecture employing a plurality of TSVs and a magnetic material disposed on a side of a substrate, in accordance with embodiments.

In embodiments, a magnetically enhanced inductor includes a magnetic material disposed over substrate surfaces other than sidewalls of a TSV. For example, the magnetic material may be disposed on a frontside or backside of the substrate in a manner that enhances inductive magnetic flux. FIG. 1C schematically illustrates an integrated VR architecture employing a magnetically enhanced inductor, in accordance with such embodiments. As shown, an IC chip 105 includes an IC 107 formed on the frontside 211 of the substrate 210. The IC 107 includes both power supply circuitry (e.g., a VR including power switch array 119 and PWM 114) and load circuitry 108A coupled through at least a pair of TSVs 144 and 143 connected in series by interconnect metallization 140 disposed over a magnetic material 141D to form a three-dimensional (3D) coil. While in the exemplary embodiment the TSVs 144 and 143 are non-magnetic, embodiments of course may be combined such that a magnetically enhanced inductor employs both the magnetic material 141D and a MTSV. As described further elsewhere herein, a magnetically enhanced 3D coil may have any number of series connected TSVs to arrive at a desired inductance with reduced form factor relative to non-magnetically enhanced architectures. For the exemplary embodiment with the magnetic material 141D disposed on a backside of the substrate 210, opposite the frontside 211 where the IC 107 is disposed, processing associated with formation of the magnetic material is advantageous removed from IC processing. Furthermore, inductor performance is advantageously decoupled from the thickness of the substrate 210.

Notably, the magnetically enhanced inductor embodiments illustrated by FIG. 1C may also be extended to 3DIC architectures, such as those described in the context of FIG. 1A for MTSV embodiments. For such 3DIC embodiments, at least one of a plurality of stacked chips includes a magnetic material disposed on a side of chip substrate. Interconnect metallization connected two TSVs in series may then be disposed over the magnetic material substantially as illustrated for metallization 140 in FIG. 1C, or alternatively, interconnection of two TSV may be through metallization disposed on an adjacent chip, for example, through one or more microbumps as described elsewhere herein in the context of FIG. 4C. In further embodiments where a plurality of stacked chips includes a magnetic material disposed on a side of chip substrate, one or more inductors may utilize the magnetic material to supply a plurality of power rails across a plurality of ICs and/or IC chips in a 3DIC architecture. In further embodiments where a magnetically enhanced inductor employs a plurality of magnetic materials disposed on a side of a chip substrate, a 3D coil spanning multiple chips may also have magnetic material at two opposite ends of the coil (disposed on backsides of two different chip substrates) with TSVs routing the coil through any intervening substrates.

Figure 2A:
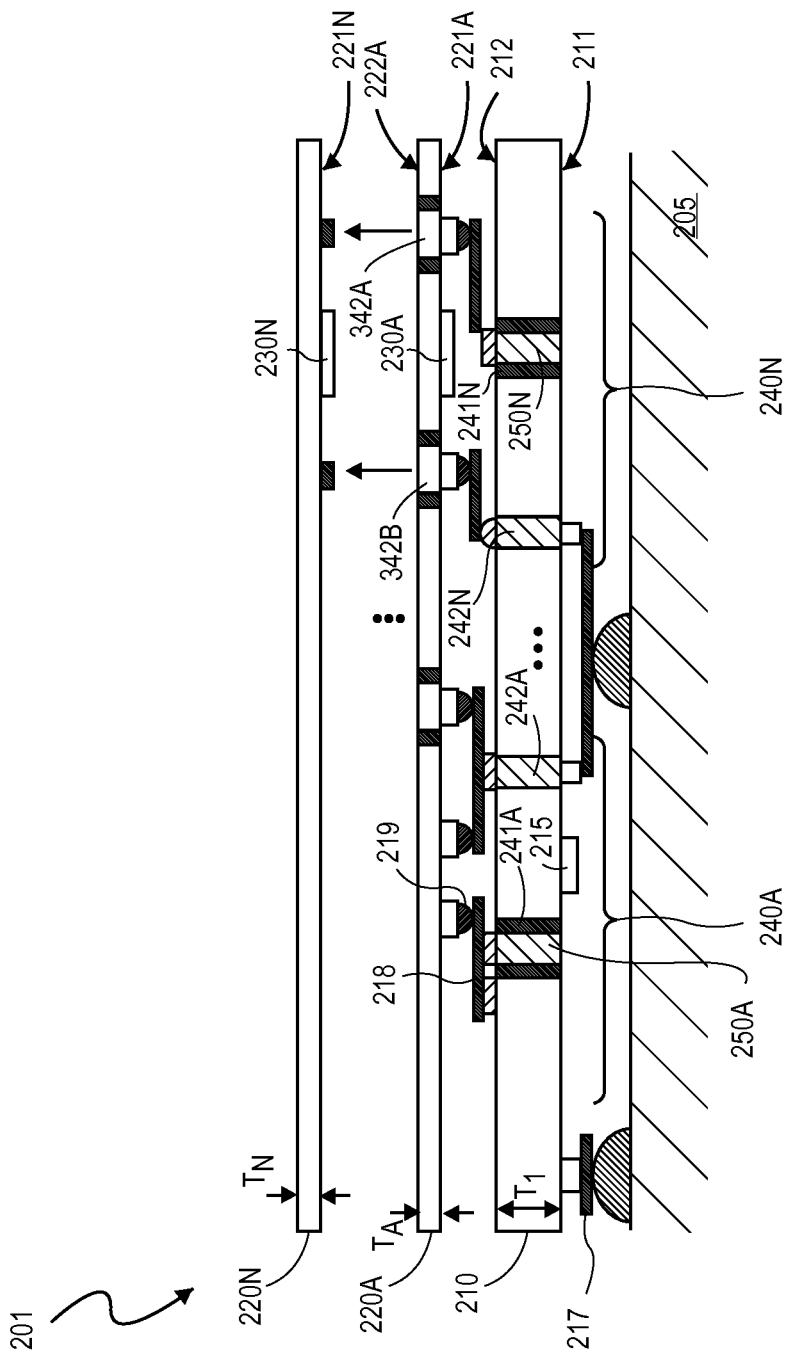
FIG. 2A is a cross-sectional view illustrating a 3DIC integrated VR architecture employing magnetic TSVs that include a liner of magnetic material; in accordance with embodiments.

FIG. 2A is a cross-sectional view further illustrating mechanical aspects of a 3DIC 201 with an integrated VR employing MTSVs, in accordance with embodiments. As shown, a support 205 (e.g., motherboard, package substrate, etc.) is coupled to bottom substrate 210 through bumps and top level metallization 217 formed on the frontside 211. A first MTSV and TSV pair 240A couples an output rail of VR circuitry 215 with the fill metal 250A extending through the substrate 210 and completely surrounded by the magnetic material 241A, and couples a ground rail with the fill metal 242A. On the backside 212, redistribution metallization 218 couples the power supply rails through microbumps 219 (or equivalent) to a frontside 221A of the stacked substrate 220A where power is routed to an INTEGRATED CIRCUIT BLOCK 230A formed thereon. Alternatively, power is further passed to an upper level substrate 220N by (non-magnetic) TSVs 342A, 342B extending to the backside 222A, for example to power an INTEGRATED CIRCUIT BLOCK 230N disposed on the frontside 221N. A similar configuration is implemented for another MTSV and TSV pair 240N to couple a power rail of another VR circuit with the fill metal 250N completely surrounded by the magnetic material 241N, and to couple a ground rail with the fill metal 242N. As illustrated, the bottom substrate 210 may have a substrate thickness $T_1$ that is greater than that of the various stacked substrates $T_A$, $T_N$ to achieve desired inductor parameters where the length of the single MTSV defines a total conductive length of the inductor that extends adjacent to magnetic material to form an inductor without needing to form turns in the conductor (i.e., "coiless"). For example $T_1$ may be thinned to 300-500 μm while $T_A$, $T_N$ may be 100 μm, or less.

Figure 2B:
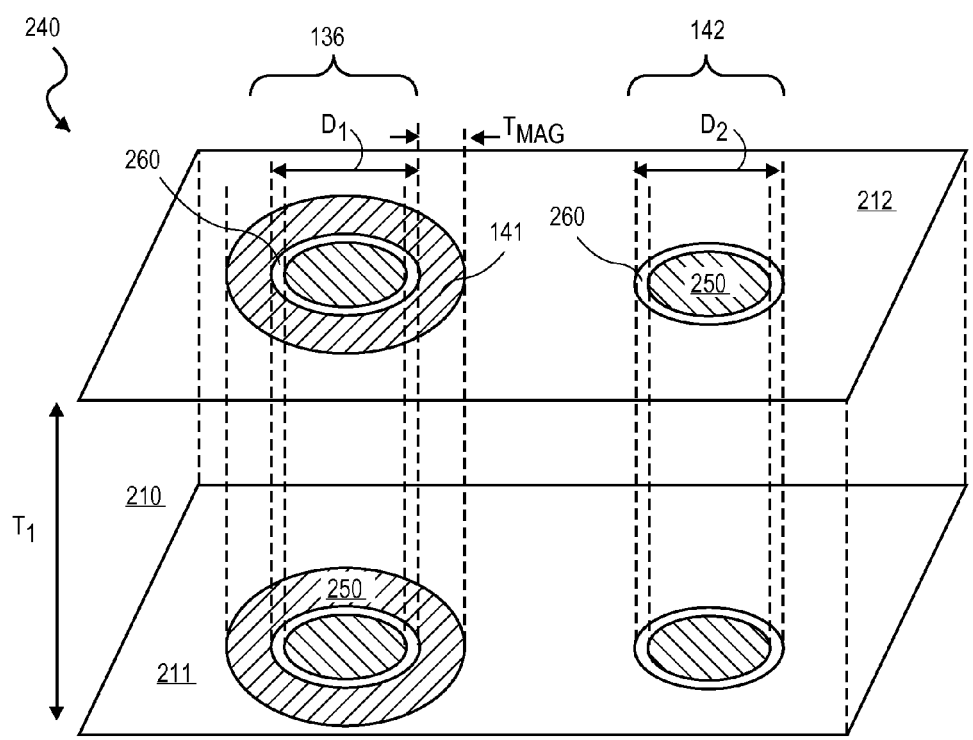
FIG. 2B is an isometric view of an MTSV and a non-magnetic TSV, in accordance with embodiments.

FIG. 2B is an isometric view of a MTSV and a non-magnetic TSV pair 240 extending through the substrate 210 between the substrate frontside 211 and backside 212, in accordance with embodiments. As shown, the MTSV 136 includes a fill metal 250 forming a wire of diameter $D_1$ surrounded by an annulus of magnetic material 141. With the magnetic material 141 forming a via liner, a closed magnetic core is formed around the fill metal 250. The fill metal 250 may be any metal in the art, such as but not limited to copper (Cu). In embodiments, the magnetic material 141 is a soft magnetic material (e.g., paramagnetic or ferrimagnetic). In exemplary embodiments, the magnetic material 141 is an alloy of cobalt (Co), such as but not limited to CoTaZr, or CoP. These alloys, and the like, are generally amorphous, although some texturing may be present. Disposed between the fill metal 250 and the magnetic material 141 is an intervening dielectric layer 260 providing electrical insulation between the fill metal 250 and the magnetic material 141. The dielectric layer 260 may be any conventional dielectric, such as, but not limited to, silicon dioxide (e.g., $SiO_2$), silicon nitride (e.g., $Si_3N_4$).

Generally, dimensions of the MTSV 136 may vary greatly as a function of inductor parameters desired for a given application (e.g., VR operation frequency, load circuit current/voltage requirements, VR supply voltage, etc.) and as a further function of permeability of the magnetic material 141. In exemplary embodiments, $D_1$ is between 5 and 20 μm, and the magnetic material liner is a single layer having a $T_{mag}$ between 0.5 and 1.5 μm. For such exemplary embodiments where $T_1$ is between 350 and 650 μm, permeabilities of CoP and CoTaZr are sufficient to provide inductances of at least 10-20 nH up through frequencies relevant to many integrated VR designs (e.g., up to ~100 MHz). In contrast, the non-magnetic TSV 142 having a substantially same DC resistance (e.g., mOhms) can be expected to have an inductance under 0.5 nH. As further illustrated in FIG. 2B, non-magnetic TSV 142 may employ the same fill metal 250 with fill metal diameter $D_2$ that may be the substantially the same or different than $D_1$. In the exemplary embodiment, the fill metal of non-magnetic TSV 142 is isolated from the substrate 210 by the dielectric layer 260, simplifying fabrication.

FIGS. 3A, 3B, 3C, and 3D are cross-sectional views representing certain operations of a "via-last" method 301 to fabricate the TSVs shown in FIG. 2B, in accordance with embodiments. It is noted that known "via-first" TSV fabrication techniques may also be adapted to form a MTSV based on the teaches provided herein in context of the exemplary via-last embodiments. Beginning with FIG. 3A, via holes 333A and 333B are anisotropically etched through a nitride mask on the backside 212, with for example with any suitable deep reactive ion etching (DRIE) technique known in the art. In the exemplary embodiment, the via holes 333A, 333B are etched from the backside 212, for example after substrate thinning, stopping on a front side layer 324 (e.g., passivation nitride, etc.). As shown, the via holes 333A, 333B may have a positive via slope, with the via diameter $D_{V,A}$ being larger than $D_{V,B}$ to account for magnetic material liner thickness. In the exemplary embodiment, each of the via holes 333A, 333B expose a metal pad 362A, 362B, respectively, with the metal pad 362A being of a diameter $D_{P,A}$ sufficiently small to be separated from a sidewall of the via hole 333A while the metal pad 362B is of any diameter $D_{P,B}$.

Figure 3A:
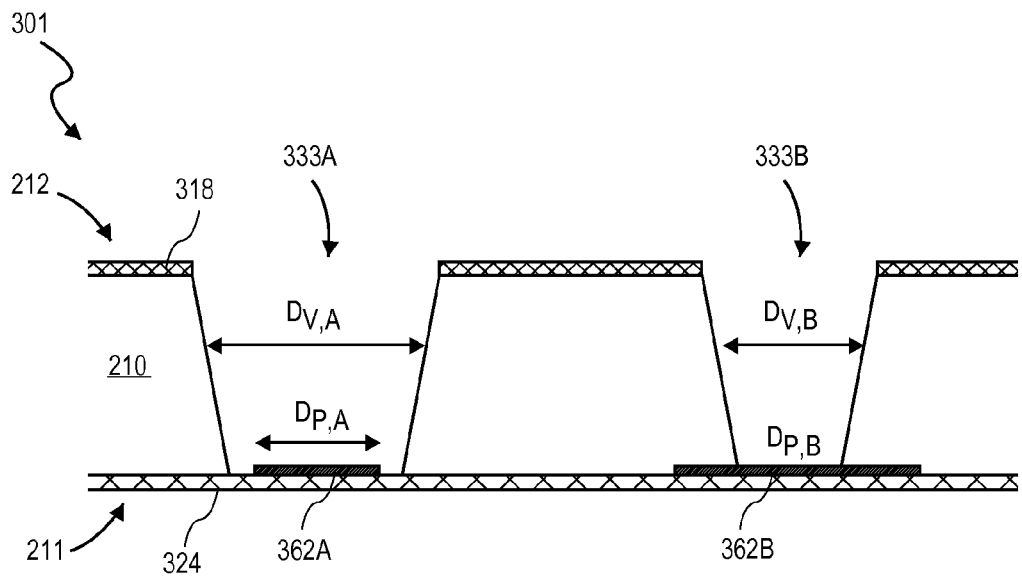
FIGS. 3A, 3B, 3C, and 3D are cross-sectional views representing certain operations in a method to fabricate the TSVs shown in FIG. 2B, in accordance with embodiments.
Figure 3B:
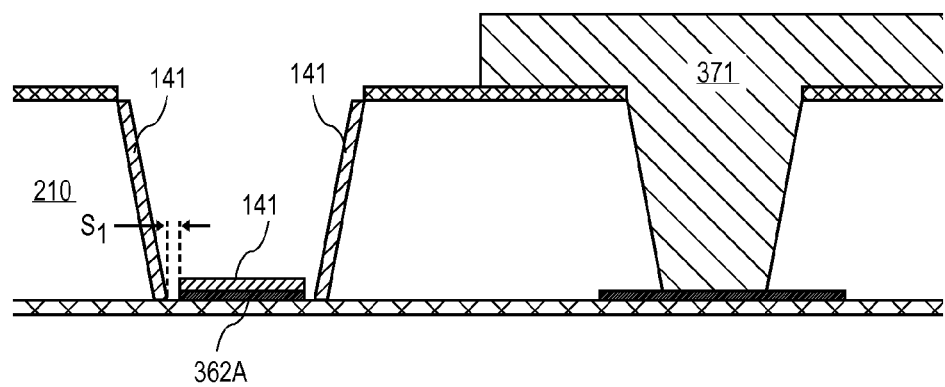

As illustrated in FIG. 3B, with the via hole 333B protected from magnetic material deposition by a mask 371, the magnetic material 141 is formed on sidewalls of the via hole 333A. Generally, the magnetic material 141 may be so formed by any process known in the art. In one exemplary embodiment, formation entails sputtering (i.e., PVD) a seed layer over the substrate 210. The magnetic material (e.g., Co alloy) is then deposited onto the seed layer electrolytically with the substrate 210 and/or metal pad 362A serving as the plating cathode. As shown in FIG. 3B, diameter $D_{P,A}$ of the metal pad 362A may be such so as to provide a spacing S between magnetic material 141 on the via sidewall and the metal pad 362A.

Figure 3C:
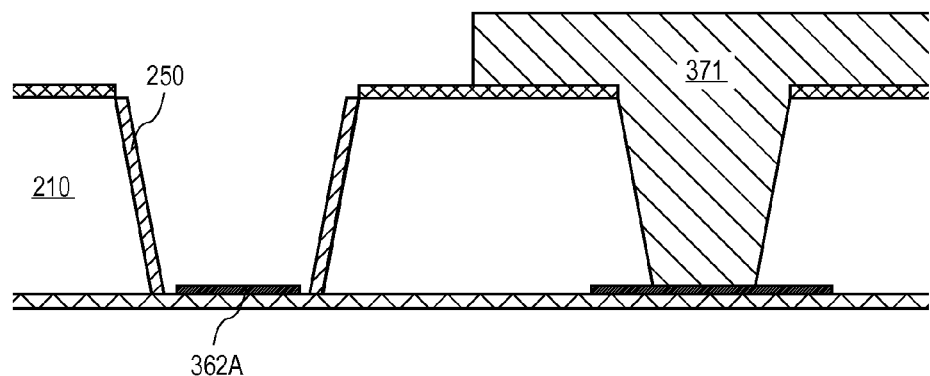

As illustrated in FIG. 3C, the metal pad 362A is exposed while retaining the magnetic material 141 on via sidewalls, for example by anisotropic etch of the magnetic material 141. Alternatively where the metal pad 362A is not exposed prior to deposition of the magnetic material 141 (e.g., using only the substrate 210 as electroplating cathode) and no magnetic material 141 is formed at the via bottom, an ansotopic etch may be utilized at this point to open the metal pad 362A. The mask 371 may then be removed.

Figure 3D:
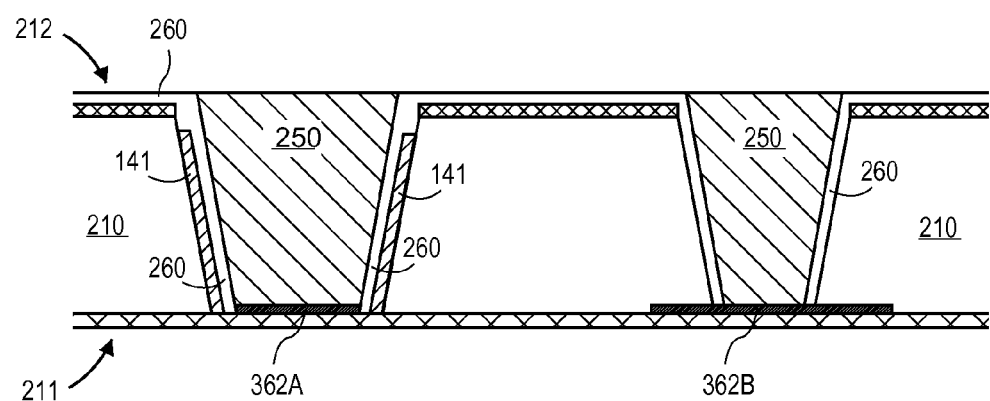

As illustrated in FIG. 3D, the dielectric layer 260 is formed over the magnetic material 141, forming an insulative liner. Any conventional process for lining a TSV may be utilized to form the dielectric layer 260, such as, but not limited to plasma enhanced chemical vapor deposition (PECVD). In the exemplary embodiment, the dielectric layer 260 is concurrently formed in the via holes 333A and 333B. While the dielectric layer 260 may be formed on the backside 212, the metal pads 362A, 362B are left open (or subsequently re-opened) from which the fill metal 250 is electroplated up using any conventional process (e.g., pads 362A, 362B coupled to the substrate 210 by antenna diodes at the frontside 211 to form fill metal plating cathode). Chemical mechanical polishing (CMP) and patterning of redistribution layer (RDL) metallization (not depicted) is then performed in accordance with conventional techniques.

Figure 4A:
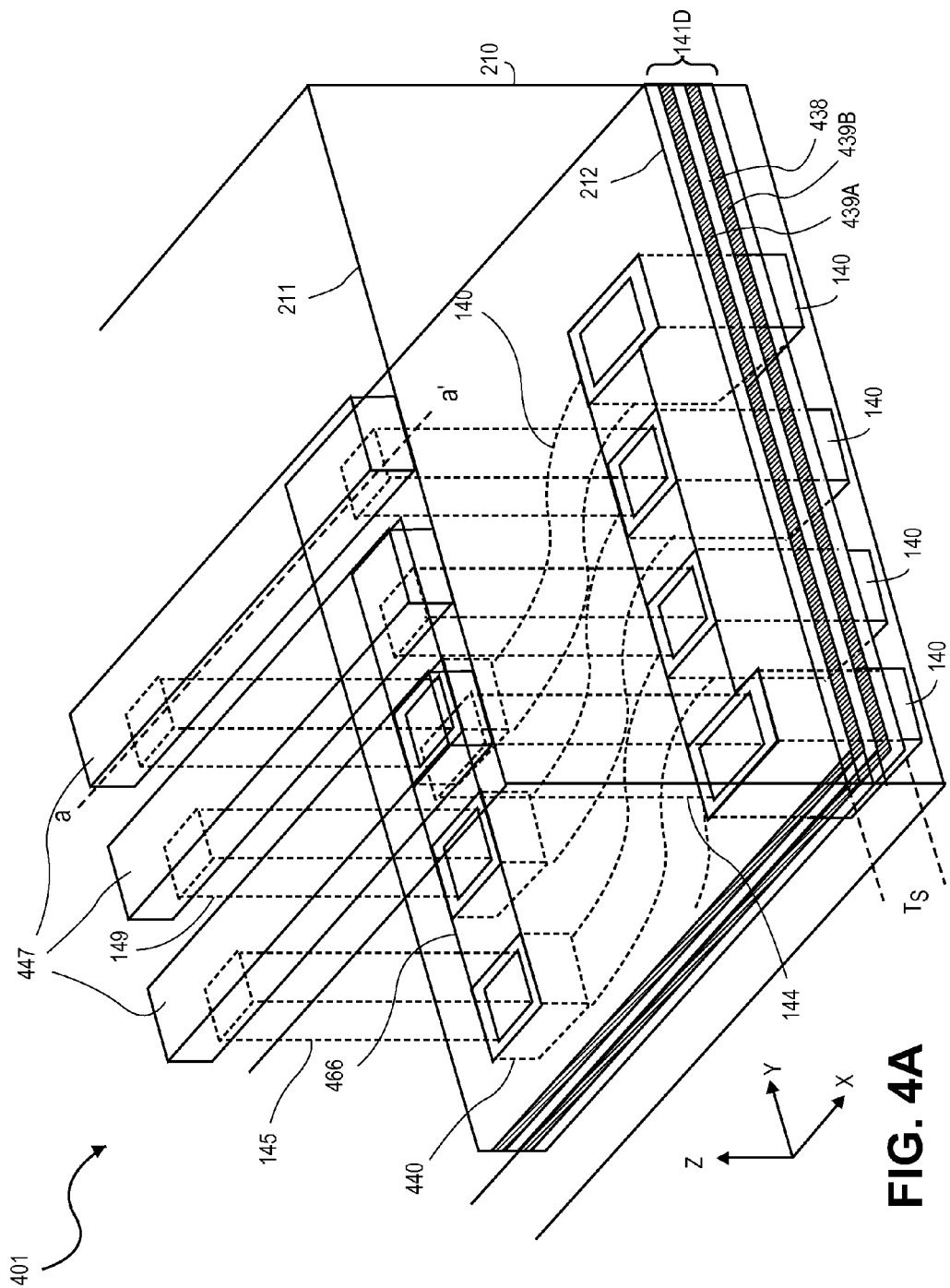
FIG. 4A is an isometric view of a magnetically enhanced inductor employing a plurality of TSVs and a magnetic material disposed on a side of a substrate to form a solenoid inductor, in accordance with embodiments.

FIG. 4A is an isometric view of a magnetically enhanced solenoid inductor 401 employing a plurality of TSVs 144, 145, 149, etc. and a magnetic material 141D disposed on a backside 212 of the substrate 210, in accordance with embodiments. As shown, the inductor 401 is a 3D coil with TSVs 144, 145, 149, etc. coupled in series by interconnect metallization 140 adjacent to the substrate backside 212 and interconnect metallization 447 on the substrate frontside 211. In the exemplary embodiment of FIG. 4A, the metallization 447 is a top level of frontside interconnect metallization while the metallization 140 is a metal redistribution layer (RDL). As such, the TSVs 144, 145, 149 make z-dimensional runs through the substrate 210 with frontside interconnect metallization levels (e.g., metal 1-7, etc.) extending through an active device portion of the frontside to connect the TSVs to the top level of frontside metallization 447. As one or more of the top level metallization and RDL metallization is also advantageously employed for routing of signals to/from an IC disposed on the frontside 211 (e.g., VR circuitry), the top level metallization and RDL metallization are ideally under 10 μm in thickness (z-dimension) for greater routing density. The presence of the magnetic material 141D can increase the inductance for a give DC resistance of the coil to improve the resistance:inductance ratio of the inductor 401 so significantly that the top level metal and RDL may even be less than 5 μm in exemplary LC-VR embodiments. Inductance efficiency enhancement by the magnetic material 141D also enables higher VR power efficiencies at lower PWM frequencies and over a wider range of current loads.

In the exemplary embodiment, the magnetic material 141D is a stack having multiple layers of magnetic material 439A, 439B with an intervening dielectric 438 there between. While the exemplary stack may advantageously reduce parasitic eddy currents within the magnetic material 141D, the magnetic material 141D may also be a single homogeneous layer. For stack embodiments, each layer of magnetic material may be any of those described elsewhere herein for magnetic material 141A or 241A (e.g., Co alloys) and the intervening dielectric 438 may be any conventional insulative material, such as, but not limited to $SiO_2$, $Si_3N_4$, and mixtures thereof. Generally, the magnetic material 141D may have any desired thickness $T_S$ with exemplary embodiments having a thickness on the order of 10% the thickness of the substrate 210, or less. As the lengths of the TSVs 144, 145, 149 do not define the portion of the inductor 401 that spans magnetic material, the inductor 401 can provide inductance values over 10 nH even for substrate thickness below 100 μm with $T_S$ being 10 μm, or less. For a given thickness $T_S$, a stack may have any number of magnetic layers 439A, 439B, etc. For one exemplary embodiment where the substrate 210 is approximately 100 μm and each magnetic material layer 439A, 439B, etc. has a thickness between 0.5 and 15 μm, a stack of 5-10 magnetic layers may be provided where $T_S$ is no greater than 10 μm as the dielectric 438 need only be 25-50 nm thick.

Figure 4B:
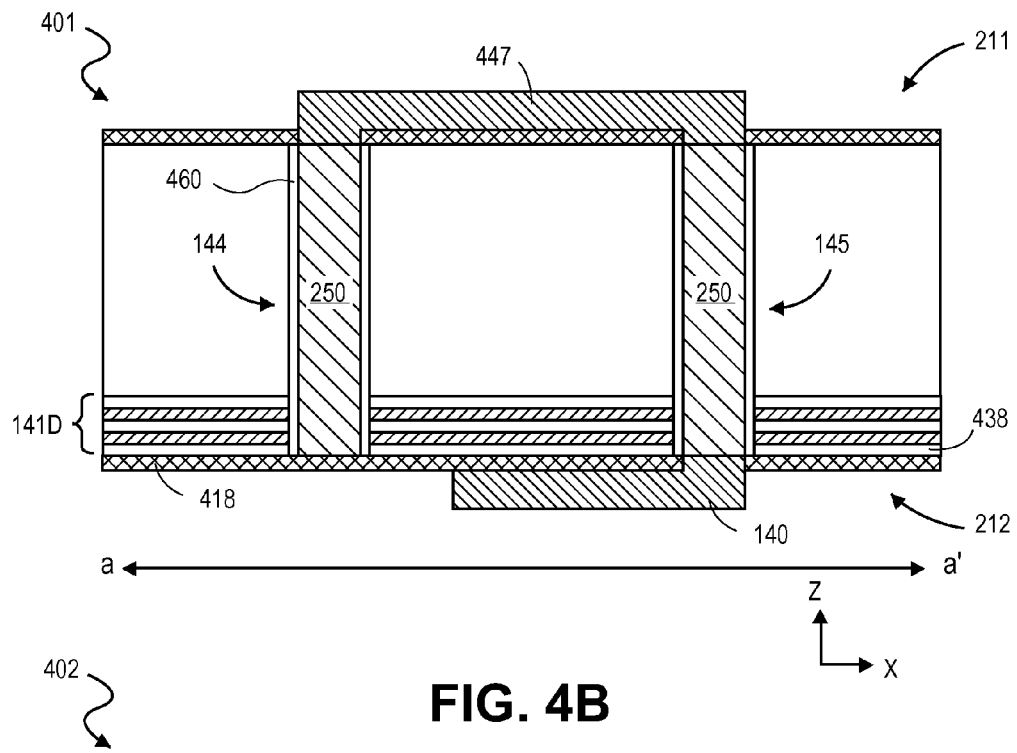
FIGS. 4B, 4C, and 4D are cross-sectional views illustrating magnetically enhanced inductors, in accordance with embodiments.
Figure 4C:
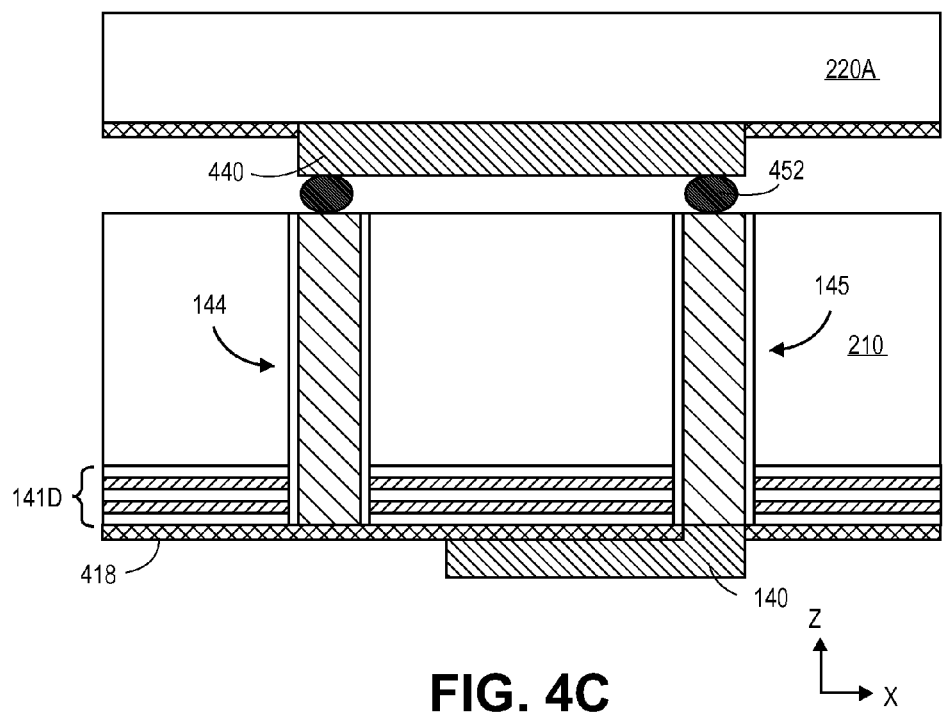
Figure 4D:
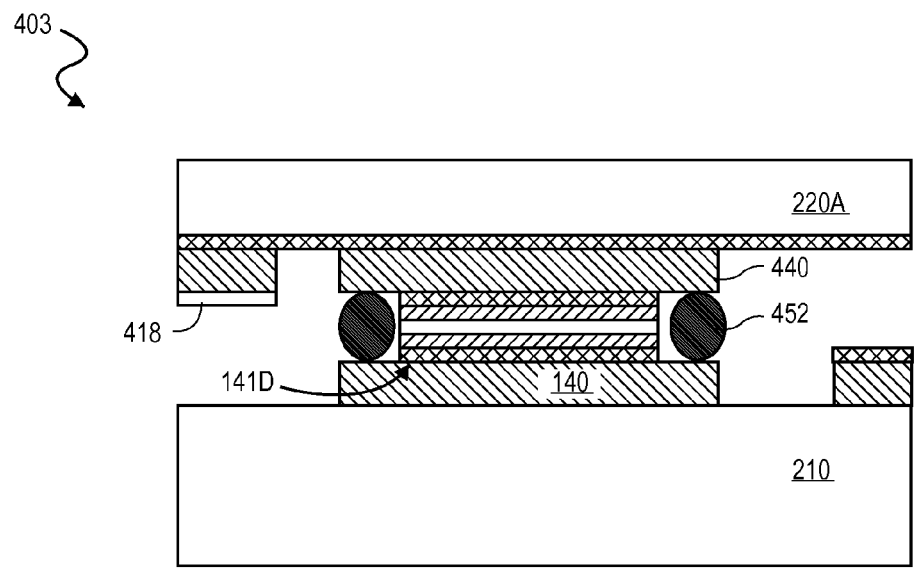

FIGS. 4B, 4C and 4D are cross-sectional views illustrating magnetically enhanced inductors, in accordance with embodiments. FIG. 4B further illustrates a cross-sectional view of the inductor 401 along the a-a' line illustrated in FIG. 4A. As shown, the fill metal 250 is isolated from the magnetic material 141D by a dielectric layer 460 forming a via liner, which may be any material used in the art for TSV isolation. The TSVs 144 and 145 are connected in series by the frontside metallization 447 while the TSV 145 may be further coupled in series to a third TSV by the (RDL) metallization 140 with any number of TSVs employed to form successive coil turns (e.g., 2, 3, 4, etc.). As illustrated, the metallization 140 is disposed over the magnetic material 141D with either the intervening dielectric 438 or an additional dielectric passivation 418 (e.g., $SiO_2$, $Si_3N_4$, etc.) insulating the metallization 140 from a magnetic layer (e.g., 439B). In the exemplary embodiment illustrated in FIGS. 4A and 4B, the magnetic material 141D spans the distance between TSVs 144, 145 along the x-dimension, and extends beyond the TSVs, and may even completely cover the backside of the substrate 210. As shown in FIG. 4A, cutouts or openings 466 are formed around a set of TSVs along the y-dimension such that no magnetic material is present between adjacent TSVs in this dimension.

FIG. 4C further illustrates a 3DIC embodiment where at least one of the interconnects coupling TSVs together to form a magnetically enhanced 3D coil inductor 402 is provided by a second, adjacent chip. In the illustrative embodiment, the RDL metal of the substrate 210 is again disposed over magnetic material 141D to couple two TSVs together in series while a second RDL 440 present on the substrate 220A couples the TSVs 144, 145 together in series, for example through bumps/microbumps 452.

FIG. 4D further illustrates a 3DIC embodiment a magnetically enhanced 3D coil inductor 403 includes the magnetic material 141D is disposed over RDL metal 140 of the substrate 210 (and/or over RDL metal 440 on the substrate 220A) with the bumps/microbumps 452 interconnecting the opposing RDL metals 140, 440 to complete an inductor turn. In such an embodiment, no TSV is employed (being replaced by the bumps/microbumps 452).

Figure 4E:
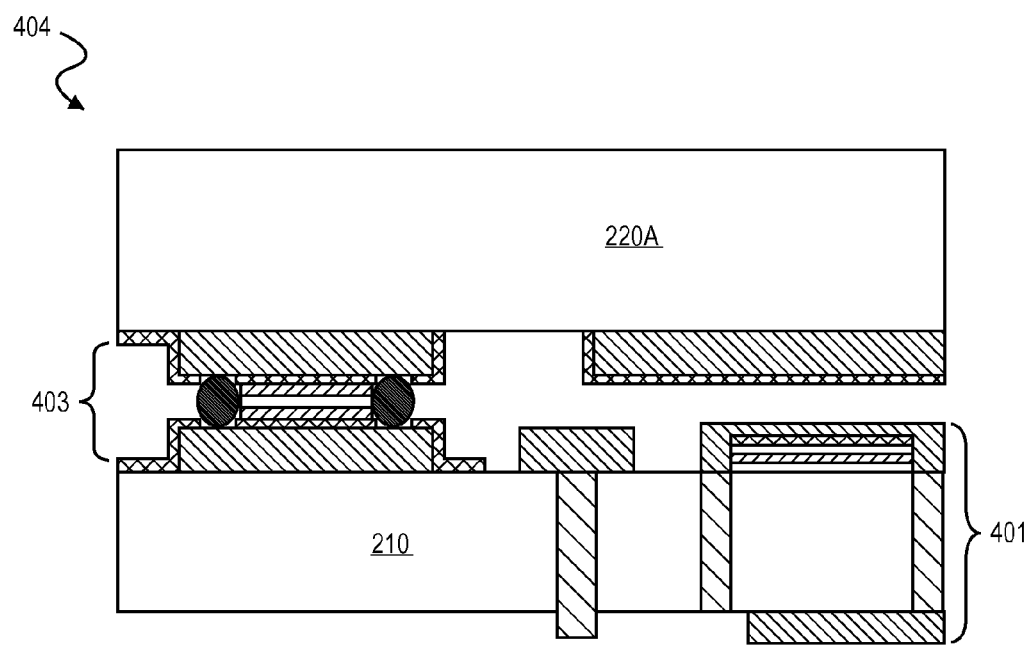
FIG. 4E is a cross-sectional view illustrating inductor embodiments as illustrated in FIGS. 4B and 4D combined, in accordance with an embodiment.

Notably, the various embodiments described in the context of FIGS. 4A-4D are combinable in any manner because the techniques and structures are not mutually exclusive. For example, FIG. 4E illustrates a cross-sectional view of first and second chips forming a 3DIC 404 including the first substrate 210 and second substrate 220A. As illustrated the first substrate 210 includes the inductor 401 in a first region and the inductor 403 in a second region (formed in conjunction with the second substrate 220A). As such, inductors of different performance may be combined in a serialized stack with each substrate having a particular (e.g., different) magnetic material.

Generally, there are many alternative methods to fabricate magnetically enhanced inductors in accordance with the exemplary inductor 401. Methods may be either "magnetic material first" where a magnetic material is deposited on a substrate after thinning and before via etching or "magnetic material last" where a magnetic material is deposited on a substrate after via etch. FIGS. 5A, 5B, 5C, and 5D are cross-sectional views representing certain operations of a method 501 to fabricate the magnetically enhanced inductor 401, in accordance with a "magnetic layer last" embodiment. The method 501 begins with forming via holes 533A, 533B into a thinned substrate 210 (e.g., 50-100 μm, or more). Again, a backside via-last technique is depicted FIG. 5A, merely as an instructive embodiment. DRIE etch may form vial holes 533A, 533B substantially as previously described elsewhere herein. Liner dielectric 460 is deposited and the pads 562A, 562B opened. Fill metal 250 is deposited, for example with Cu electroplating. CMP polish of the plate metal overburden arrives at the structure illustrated in FIG. 5B.

Figure 5A:
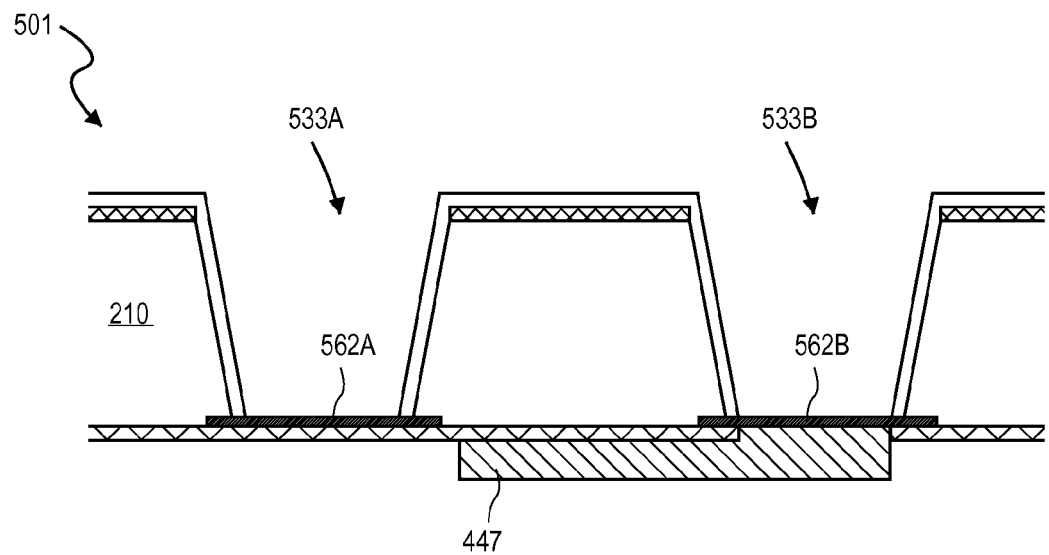
FIGS. 5A, 5B, 5C, and 5D are cross-sectional views representing certain operations in a method to fabricate the magnetically enhanced inductor shown in FIG. 4A, in accordance with embodiments.
Figure 5B:
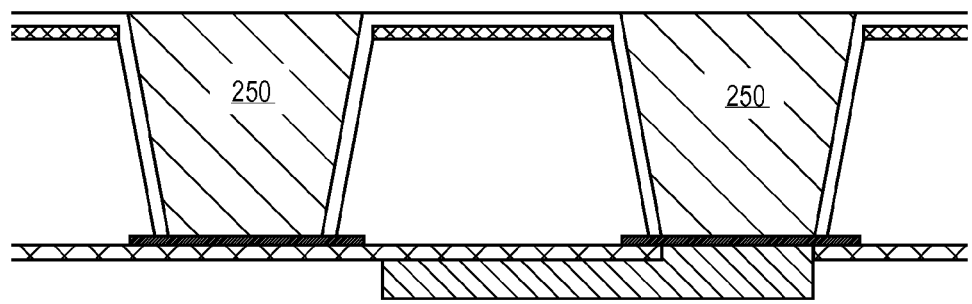
Figure 5C:
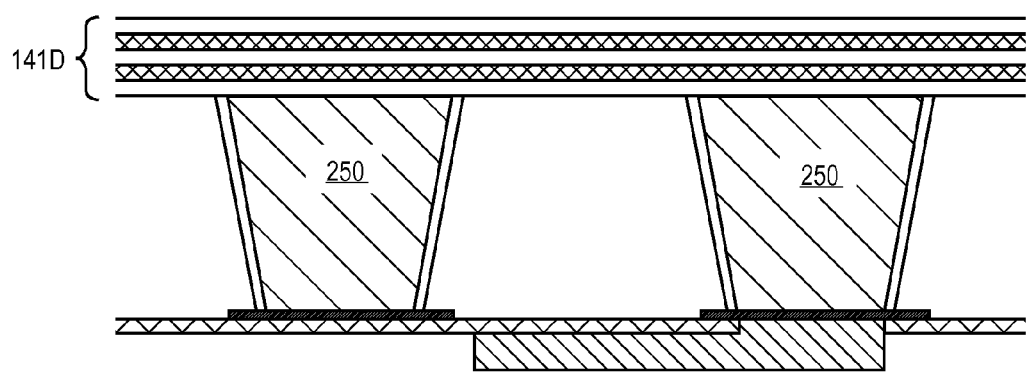
Figure 5D:
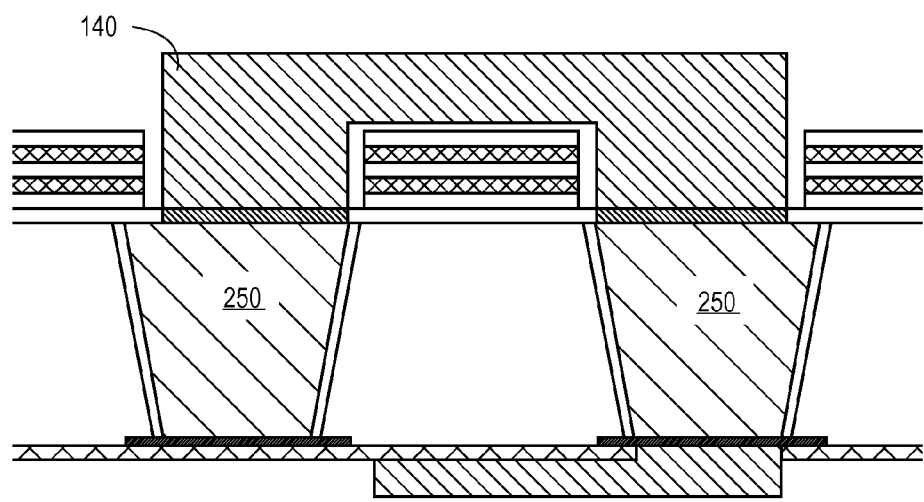

The magnetic material (stack) 141D is then deposited, for example through successive sputter depositions and dielectric depositions (e.g., PECVD), as depicted in FIG. 5D, the magnetic material 141D is patterned and the metallization 140 plated up from the fill metal 250 using conventional backside RDL formation techniques, as illustrated in FIGS. 5C and 5D. Similar techniques would be applied for a magnetic material first flow, with the stack deposition and patterning being the same and/or with the via hole extending through the magnetic material.

Figure 6A:
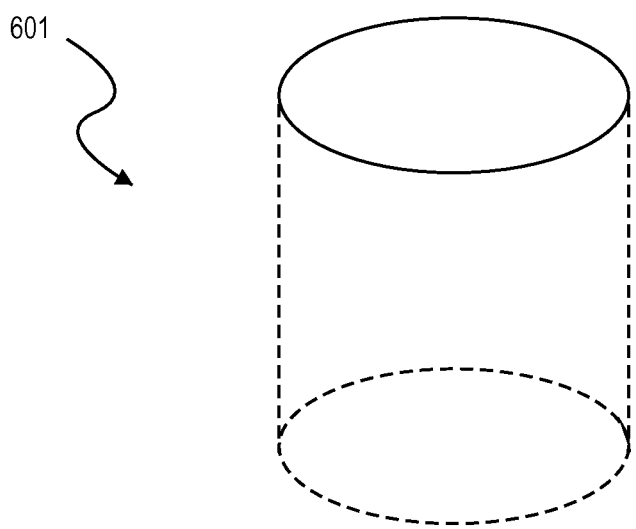
FIGS. 6A and 6B are isometric view of TSVs employed in a magnetically enhanced inductor, in accordance with embodiments.
Figure 6B:
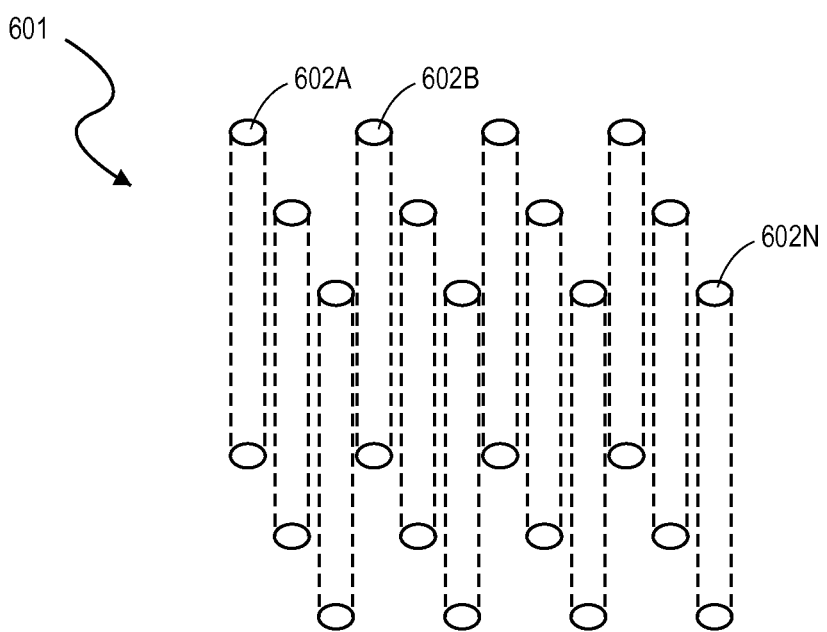

In the embodiments described herein the TSVs illustrated may be considered "power vias" having relatively large diameters of up to 20 μm, for example. However, it is noted that a plurality of array smaller TSVs (e.g., 5 μm) may also be electrically coupled in parallel to form inductive elements of equivalent DC resistance as a power via, but with potentially different inductance values. FIGS. 6A and 6B are isometric views of TSVs employed in a magnetic enhanced inductor, in accordance with embodiments. In FIG. 6A, a single power via 601 defines a conductive wire cross-sectional area passing through a substrate. In FIG. 6B, a TSV array 601 also defines a conductive wire cross-sectional area passing through a substrate as the total conductance associated with sum of the individual TSVs 602A, 602B, 602N. For MTSV embodiments, magnetic liners may be present one or more (e.g., all) of the individual TSVs 602A, 602B, 602N. Likewise, for embodiments employing a magnetic material on a side of a substrate, the magnetic material may be present in the regions between one or more (e.g., all) the individual TSVs 602A, 602B, 602N, or not.

Figure 7:
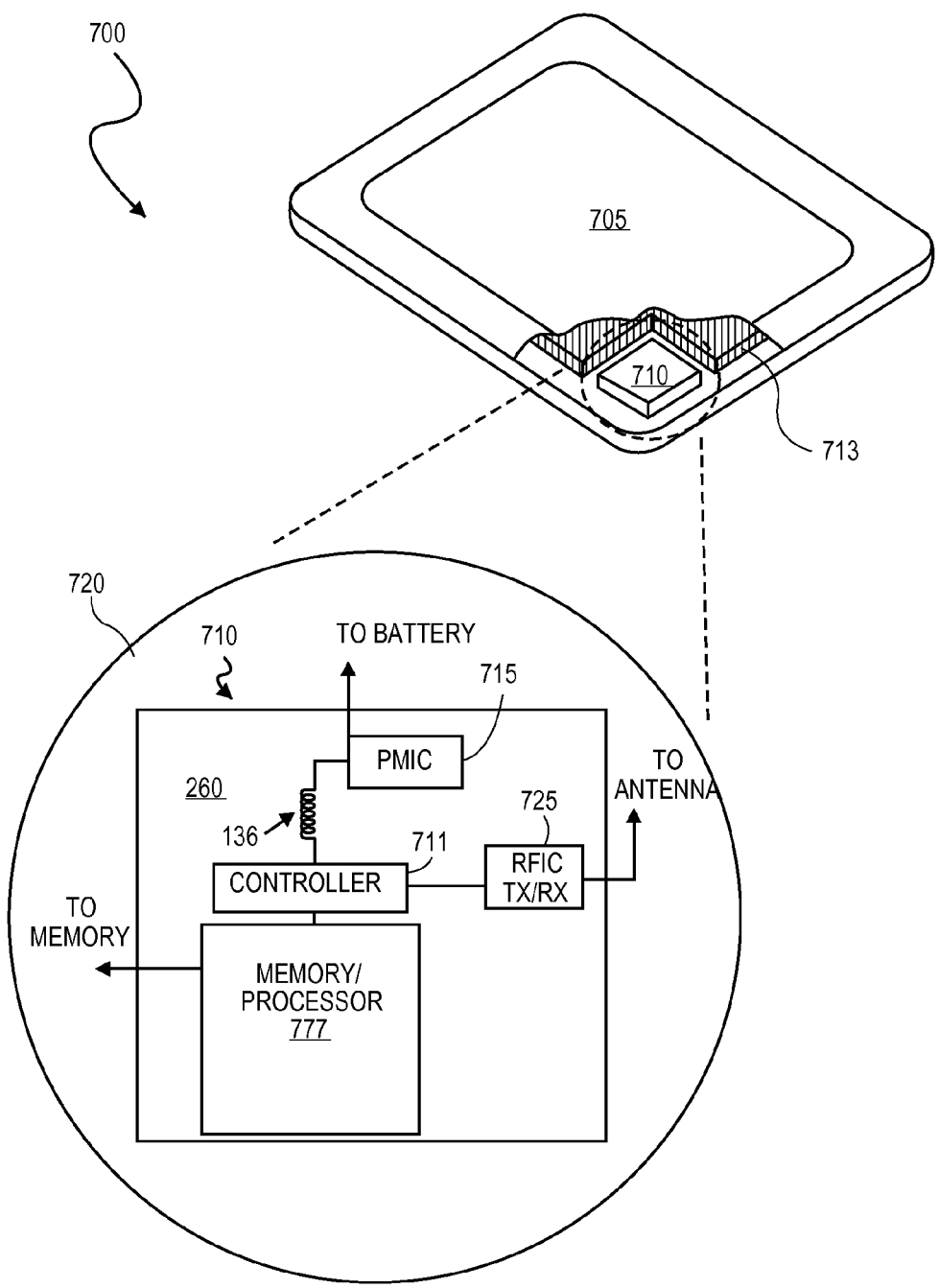
FIG. 7 is an isometric view of a mobile computing platform employing a magnetically enhanced inductor, in accordance with an embodiment of the present invention.

FIG. 7 is an isometric view and schematic of a mobile computing platform 700 which employs an IC including integrated LC VR circuitry, in accordance with embodiments of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 which in the exemplary embodiment is a touch-screen (capacitive, inductive, resistive, etc.), a chip-level (SoC) or package-level integrated system 710, and a battery 713.

The integrated system 710 is further illustrated in the expanded view 720. In the exemplary embodiment, packaged device 777 includes at least one memory chip (e.g., RAM), and/or at least one processor chip (e.g., a multi-core microprocessor and/or graphics processor), for example in a 3DIC configuration. In embodiments, as described in more detail elsewhere herein, a LC-VR employed to power at least one of the memory chip and processor chip includes a magnetically enhanced inductor utilizing TSVs. The packaged device 777 is further coupled to the board, substrate, or interposer 205 along with, one or more of a power management integrated circuit (PMIC) 715, RF (wireless) integrated circuit (RFIC) 725 including a wideband RF (wireless) transmitter and/or receiver (e.g., including a digital baseband and an analog front end module further comprises a power amplifier on a transmit path and a low noise amplifier on a receive path), and a controller thereof 711. One or more of these ICs may be in a 3DIC architecture and powered by a fully integrated LC-VR in accordance with one or more of the embodiments described herein.

Functionally, the PMIC 715 performs battery power regulation, DC-to-DC conversion, etc., and so has an input coupled to the battery 713 and with an output providing a current supply to all the other functional modules, for example through an LC-VR. As further illustrated, in the exemplary embodiment the RFIC 725 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 777 or within a single IC (SoC) coupled to the package substrate of the packaged device 777.

Figure 8:
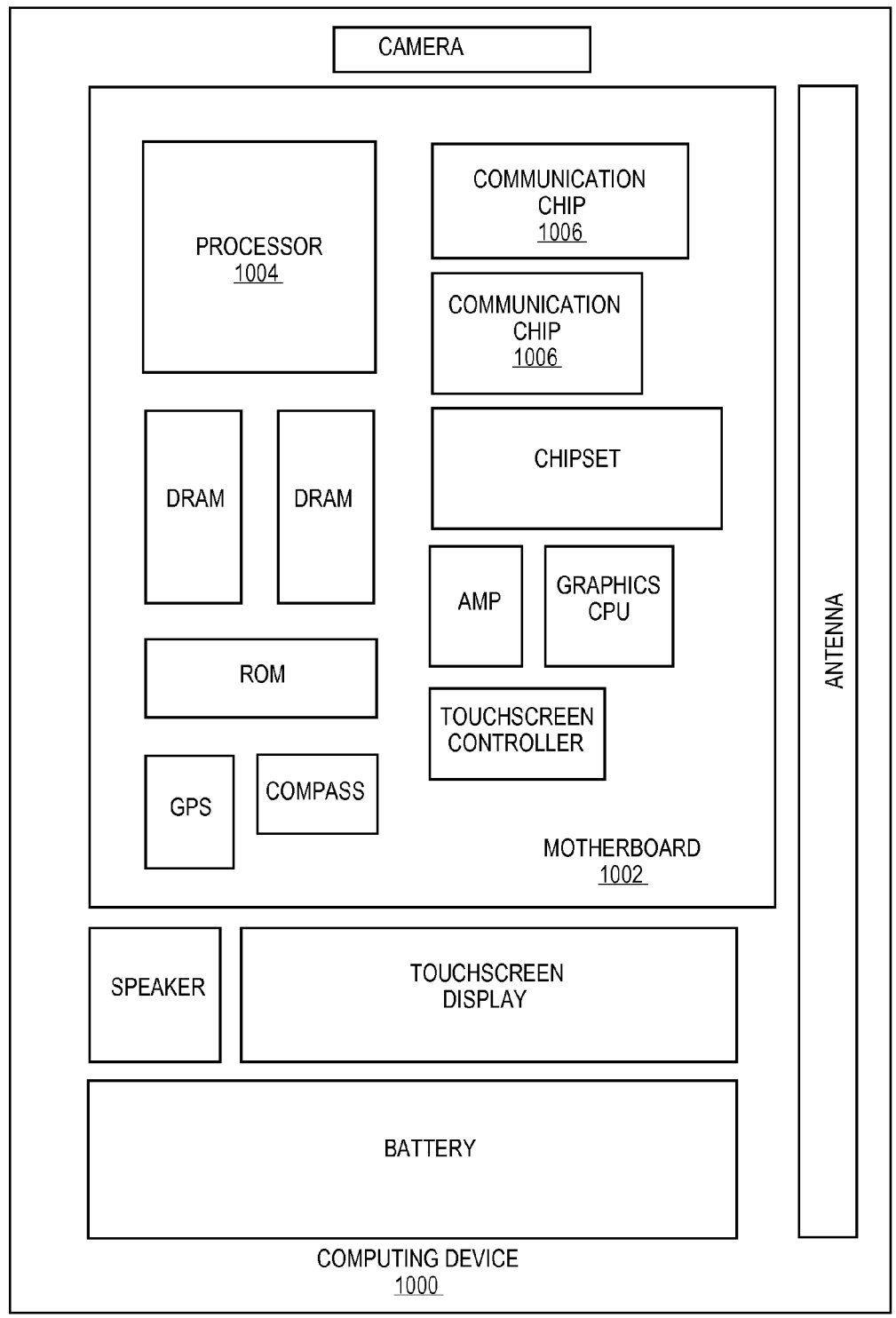
FIG. 8 is a functional block diagram of the mobile computing platform illustrated in FIG. 7, in accordance with an embodiment of the present invention.

FIG. 8 is a functional block diagram of a computing device 1000 in accordance with one embodiment of the invention. The computing device 1000 may be found inside the mobile computing platform 700, for example, and further includes a board 1002 hosting a number of components, such as but not limited to a processor 1004 (e.g., an applications processor) and at least one communication chip 1006. In embodiments, at least one of the processor 1004 and communication chip 1006 is powered by a integrated LC-VR in accordance with at least one embodiment described elsewhere herein. The processor 1004 is physically and electrically coupled to the board 1002. The processor 1004 includes an integrated circuit die packaged within the processor 1004. The term "processor" may refer to any device or portion of a device that processes electronic data from registers and/or memory to transform that electronic data into other electronic data that may be stored in registers and/or memory.

In some implementations the at least one communication chip 1006 is also physically and electrically coupled to the board 1002. In further implementations, the communication chip 1006 is part of the processor 1004. Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to those described elsewhere herein. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A microelectronic device, comprising: an integrated circuit (IC) disposed on a substrate, wherein the substrate is a silicon substrate; a magnetically enhanced inductor entirely disposed in the substrate and electrically coupled to the IC, wherein the inductor further comprises: a through substrate via (TSV) extending through the substrate; and a magnetic material disposed over a surface of the substrate, adjacent to a conductive length of the inductor; wherein the TSV is a magnetic TSV (MTSV) with the magnetic material forming a liner on sidewalls of the TSV with a conductive fill metal disposed within the magnetic liner and with an intervening dielectric liner there between.

2. The device of claim 1, wherein a length of a single MTSV defines a total conductive length of the inductor extending adjacent the magnetic material to form an inductor without needing to form turns along the conductive length.

3. The device of claim 1, wherein the fill metal has a diameter between 5 and 20 jam, and the magnetic material liner has a thickness between 0.5 and 1.5 pm.

4. The device of claim 1, wherein the magnetic material is disposed on a first side of the substrate, wherein the TSV is one of at least a pair of TSVs coupled in series by a first interconnect metallization disposed over the magnetic material to form a three-dimensional coil.

5. The device of claim 4, wherein the IC is disposed on a frontside of the substrate, wherein the magnetic material is disposed on a backside of the substrate, and wherein the first interconnect metallization comprises a redistribution metallization layer.

6. The device of claim 4, wherein the substrate has a thickness less than 100 μm, and wherein the magnetic material has a thickness no greater than 10 μm.

7. The device of claim 6, wherein the magnetic material comprises a stack having a plurality of magnetic material layers, wherein adjacent magnetic material layers within the stack are spaced apart by an intervening dielectric layer.

8. The device of claim 1, wherein the IC further comprises:
a power supply circuit electrically coupled to a first end of the inductor; and a load circuit electrically coupled to a second end of the inductor to be powered by the power supply circuit.

9. A microelectronic device, comprising: a first voltage regulator (VR) circuit disposed on a first side of a first substrate; a first magnetically enhanced inductor disposed in the first substrate and having a first end coupled to a power rail of the first VR circuit, wherein the first inductor further comprises: a first through substrate via (TSV) extending through the first substrate; and a first magnetic material disposed over a surface of the first substrate; and a first load circuit disposed on a first side of a second substrate stacked upon the first substrate, wherein the first load circuit is coupled to a second end of the first inductor to receive power from the power rail of the first VR circuit.

10. The device of claim 9, wherein the first TSV is a magnetic TSV (MTSV) with magnetic material forming a liner disposed on sidewalls of the first TSV and a fill metal disposed within the magnetic material liner with an intervening dielectric liner there between;
  wherein the power rail of the first VR circuit electrically couples to a first end of the MTSV;
  wherein one or more decoupling capacitor is coupled to a second end of the MTSV through a redistribution metallization layer disposed on a second side of the substrate, opposite the first side; and
  wherein the load circuit is coupled to the one or more decoupling capacitors.

11. The device of claim 10, further comprising a TSV lacking a magnetic liner and electrically coupling the load circuit to a ground rail of the first VR circuit.

12. The device of claim 10, wherein the first VR circuit comprises a switching supply circuit with one or more power switches communicatively coupled to a switch controller.

13. The device of claim 10, further comprising:
  a second VR circuit disposed on the first side of a first substrate;
  a second magnetically enhanced inductor disposed on the first substrate and having a first end coupled to a power rail of the second VR circuit, wherein the second inductor further comprises:
    a second TSV extending through the first substrate; and
    a magnetic material disposed over a surface of the second substrate; and
  a second load circuit disposed on the first side of the second substrate, or disposed on a first side of a third substrate stacked upon the second substrate, wherein the second load circuit is coupled to a second end of the second inductor through one or more decoupling capacitors to receive power from the power rail of the second VR circuit.

14. The device of claim 9, wherein the magnetic material is disposed on a second side of the first substrate, wherein the first TSV is one of at least a pair of TSVs connected in series by a redistribution metallization layer disposed over the magnetic material to form a three-dimensional coil wherein;
  wherein the power rail of the first VR circuit electrically couples to a first end of the first TSV;
  wherein one or more decoupling capacitors is coupled to a second end of the series connected TSVs; and
  wherein the load circuit is coupled to the one or more decoupling capacitors.

15. The device of claim 9, further comprising:
  a microprocessor;
  a wireless communication circuit; and
  an antenna coupled to the wireless communication circuit.

16. A microelectronic device, comprising:
  an integrated circuit (IC) disposed on a substrate;
  a magnetically enhanced inductor disposed in the substrate and electrically coupled to the IC, wherein the inductor further comprises:
    a through substrate via (TSV) extending through the substrate; and
    a magnetic material disposed over a surface of the substrate, adjacent to a conductive length of the inductor, wherein the TSV is a magnetic TSV (MTSV) with the magnetic material forming a liner on sidewalls of the TSV with a conductive fill metal disposed within the magnetic liner and with an intervening dielectric liner there between.

17. The device of claim 16, wherein a length of a single MTSV defines a total conductive length of the inductor extending adjacent the magnetic material to form an inductor without needing to form turns along the conductive length.

18. The device of claim 16, wherein the fill metal has a diameter between 5 and 20 µm, and the magnetic material liner has a thickness between 0.5 and 1.5 µm.

19. The device of claim 16, wherein the IC further comprises:
  a power supply circuit electrically coupled to a first end of the inductor; and
  a load circuit electrically coupled to a second end of the inductor to be powered by the power supply circuit.

20. A microelectronic device, comprising:
  an integrated circuit (IC) disposed on a frontside of a substrate;
  a magnetically enhanced inductor disposed in the substrate and electrically coupled to the IC, wherein the inductor further comprises:
    a through substrate via (TSV) extending through the substrate; and
    a magnetic material disposed over a surface of a backside of the substrate, adjacent to a conductive length of the inductor, wherein the TSV is one of at least a pair of TSVs coupled in series by a first interconnect metallization disposed over the magnetic material to form a three-dimensional coil, and wherein the first interconnect metallization comprises a redistribution metallization layer.

21. The device of claim 20, wherein the substrate has a thickness less than 100 µm, and wherein the magnetic material has a thickness no greater than 10 µm.

22. The device of claim 21, wherein the magnetic material comprises a stack having a plurality of magnetic material layers, wherein adjacent magnetic material layers within the stack are spaced apart by an intervening dielectric layer.

23. The device of claim 20, wherein the IC further comprises:
  a power supply circuit electrically coupled to a first end of the inductor; and a load circuit electrically coupled to a second end of the inductor to be powered by the power supply circuit.

24. A microelectronic device, comprising:
  an integrated circuit (IC) disposed on a substrate, the IC comprising a power supply circuit and a load circuit; and
  a magnetically enhanced inductor disposed in the substrate and electrically coupled to the IC, wherein the power supply circuit of the IC is electrically coupled to a first end of the inductor, and the load circuit of the IC is electrically coupled to a second end of the inductor to be powered by the power supply circuit, and wherein the inductor comprises:

a through substrate via (TSV) extending through the substrate; and a magnetic material disposed over a surface of the substrate, adjacent to a conductive length of the inductor.

* * * * *